United States Patent [19]
Takamichi et al.

[11] Patent Number: 6,054,755
[45] Date of Patent: Apr. 25, 2000

[54] SEMICONDUCTOR PACKAGE WITH IMPROVED MOISTURE VAPOR RELIEF FUNCTION AND METHOD OF FABRICATING THE SAME

[75] Inventors: Hiroshi Takamichi, Ube; Yoshikazu Nakada, Okayama, both of Japan

[73] Assignee: Sumitomo Metal (SMI) Electronics Devices Inc., Mine, Japan

[21] Appl. No.: 09/168,960

[22] Filed: Oct. 9, 1998

[30] Foreign Application Priority Data

Oct. 14, 1997 [JP] Japan ................................ 9-280209
May 15, 1998 [JP] Japan ................................ 10-132787

[51] Int. Cl.$^7$ .................................................. H01L 23/495
[52] U.S. Cl. .......................... 257/667; 257/778; 257/782
[58] Field of Search ..................................... 257/666, 667, 257/676, 782, 737, 778

[56] References Cited

U.S. PATENT DOCUMENTS 5,296,738 3/1994 Freyman et al. ..................... 257/684
5,612,576 3/1997 Wilson et al. ........................ 257/788
5,808,873 9/1998 Celaya et al. ........................ 257/676

*Primary Examiner*—Wael Fahmy
*Assistant Examiner*—Roy Potter
*Attorney, Agent, or Firm*—Foley & Lardner

[57] ABSTRACT

In order that popcorning and delamination resulting from moisture vapor in a semiconductor package may be prevented, a vent hole is formed in a die-bonding area of a plastic substrate so as to extend vertically through the substrate. An upper open end of the vent hole is covered with a solder resist film and a semiconductor chip is die-bonded on the solder resist film. In the die-bonding step, the solder resist film prevents an adhesive agent from flowing into the vent hole through the upper open end, so that gas permeability of the vent hole can be ensured. Furthermore, since the solder resist film has gas permeability, moisture vapor in the package is released outside through the vent hole and the solder resist film during a reflow heating.

6 Claims, 5 Drawing Sheets

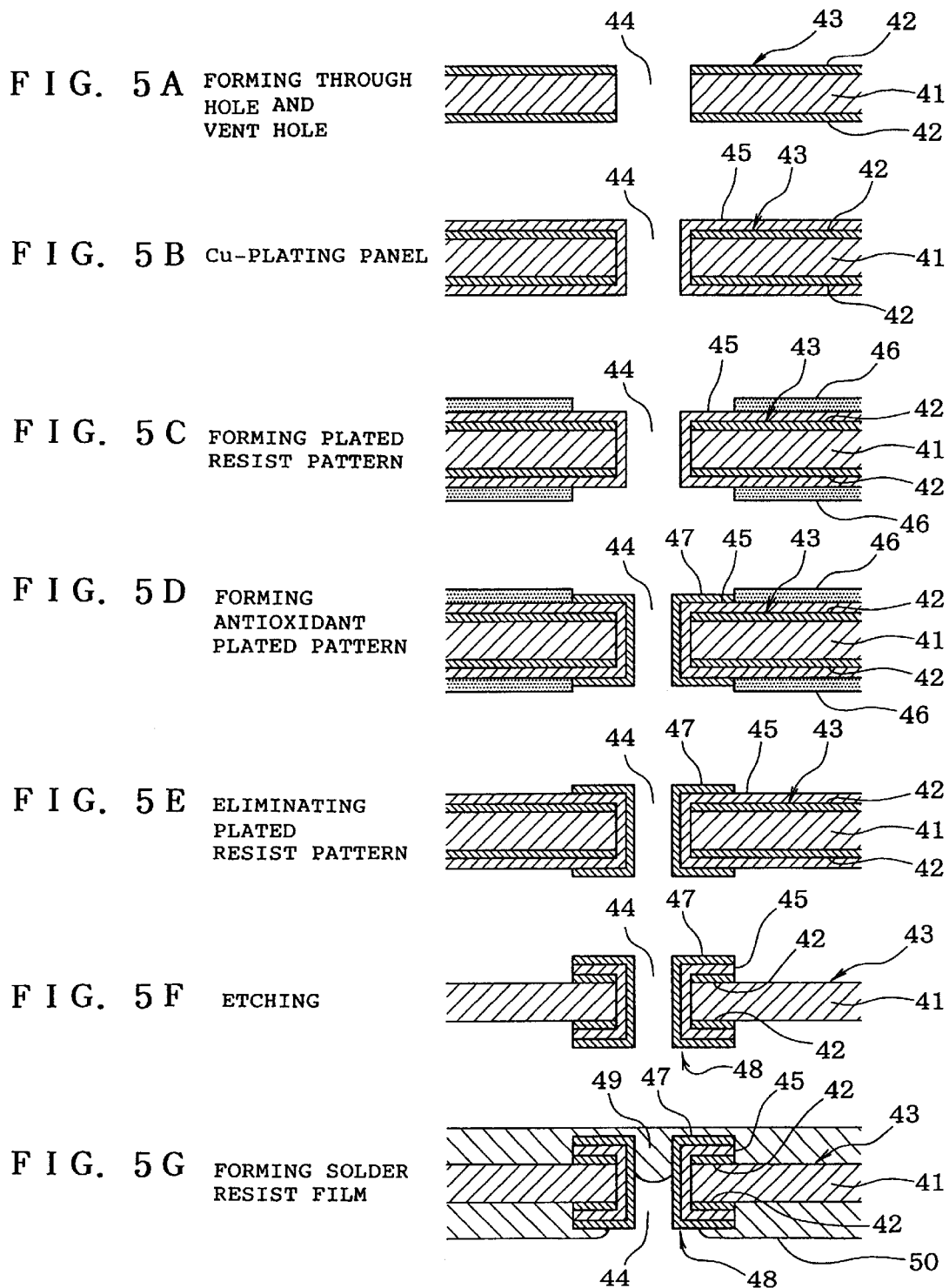

SEMICONDUCTOR PACKAGE WITH IMPROVED MOISTURE VAPOR RELIEF FUNCTION AND METHOD OF FABRICATING THE SAME

BACKGROUND OF THE INVENTION

1. Field of the Invention

This invention relates to a semiconductor package in which a semiconductor chip is die-bonded on a plastic substrate and sealed by a sealing resin, and a method of fabricating the semiconductor package.

2. Description of the Prior Art

Demand for plastic ball grid arrays (BGA) has recently been increased for satisfaction of requirements of high densification, high-speed operation and an increase in the number of pins. FIG. 2 shows a conventional plastic BGA package. As shown, the plastic BGA package comprises a semiconductor chip 12 die-bonded on an upper surface of a plastic substrate 11 by an adhesive 13 such as an Ag paste and overmolded with a sealing resin 14. A number of solder balls 15 serving as connecting electrodes are bonded to the backside of the plastic substrate 11. When the plastic BGA package is mounted on a circuit substrate, the solder balls 15 are bonded to pads of the circuit substrate by means of reflow soldering. Since the overall plastic BGA package is heated in a reflow furnace in a reflow soldering process, moisture or water content in the package is vaporized such that the vapor pressure is increased. As a result, a portion of the plastic substrate 11 on which the chip is mounted swells downward (popcorning phenomenon) or a joint between the sealing resin 14 or the semiconductor chip 12 and the plastic substrate 11 is separated (delamination).

To overcome the popcorning phenomenon and the delamination, U.S. Pat. No. 5,296,738 discloses a semiconductor package in which a plastic substrate has through vent holes vertically extending through a die-bonding area thereof. In the reflow soldering process, moisture vapor produced in the package is released through the vent holes. However, this construction results in a problem that an adhesive agent such as the Ag paste flows through the vent holes when the semiconductor chip is die-bonded to the plastic substrate by the adhesive agent.

As a countermeasure, U.S. Pat. No. 5,612,576 has proposed to close the vent holes by closing caps at the backside of the substrate. In this case, however, the adhesive agent flows into the vent holes through the upper open ends thereof in the die-bonding process, thereby clogging the vent holes. Thus, the adhesive agent prevents moisture vapor produced in the package during the reflow heating from passing through the vent holes. Consequently, the proposed construction reduces effects preventing the popcorning phenomenon and the delamination.

SUMMARY OF THE INVENTION

Therefore, an object of the present invention is to provide a semiconductor package in which the moisture vapor produced therein can reliably be released outward so that the popcorning phenomenon and the delamination can be prevented and which can improve moisture resistance thereof, and a method of fabricating the semiconductor package.

To achieve the object, the present invention provides a semiconductor package comprising a plastic substrate having a die-bonding area and a vent hole formed in the die-bonding area so as to extend vertically therethrough, the vent hole having upper and lower open ends, a solder resist film formed on the die-bonding area so as to cover the upper open end of the vent hole, a semiconductor chip die-bonded on the solder resist film on the die-bonding area of the plastic substrate, and a sealing resin overmolding the semiconductor chip.

According to the above-described semiconductor package, the upper open end of the vent hole or the opening of the die-bonded side is covered with the solder resist film. The solder resist film prevents an adhesive agent from flowing into the vent hole in the die-bonding process, so that gas permeability can be ensured in the vent hole. Furthermore, since the solder resist film has gas permeability, moisture vapor produced in the package during the reflow heating is released outside through the vent hole and the solder resist film. Consequently, since an increase in the vapor pressure in the package is restrained, the popcorning phenomenon and the delamination can be prevented.

The solder resist film covering the opening of the vent hole at the die-bonding side of the substrate can be formed by painting or printing a liquid solder resist, or by sticking a photosensitive dry film. The solder resist flows into the vent hole when the solder resist film is formed by the painting or printing of the liquid solder resist. Even in such a case, however, an increase in the vapor pressure can be restrained in the package when the vent hole has a hollow interior extending from the lower open end thereof and having a range equal to or larger than one third of a thickness of the plastic substrate. More specifically, when a range of the hollow interior of the vent hole in which the solder resist exists is smaller than two thirds of the thickness of the plastic substrate, the gas permeability of the solder resist film can be ensured in the vent hole and consequently, the increase in the vapor pressure in the vent hole can be restrained. Even if the range of the solder resist in the vent hole exceeds two thirds of the thickness of the plastic substrate during the painting of the resist, the hollow area equal to or larger than one third of the thickness of the plastic substrate can be ensured in the vent hole when part of the solder resist in the vent hole is eliminated at the backside of the substrate by a developing process.

The vent hole preferably has a diameter ranging between 0.15 mm and 0.5 mm. This range of the diameter of the vent hole is a minimum requirement providing sufficient gas permeability.

Either a subtractive method or an additive method may be employed for forming wiring patterns on both sides of the plastic substrate. When a double-side copper-clad laminate is used as the plastic substrate in the subtractive method, a Cu plating is applied to an inner circumferential surface of a through-hole formed in the laminate. In this case, the Cu plating is also applied to an inner circumferential surface of the vent hole in the step of applying the Cu plating to the through hole. An Ni—Au plating etc. needs to be applied to an exposed portion of the Cu plated coat for prevention of oxidation. A step of applying the Ni—Au plating to the exposed portion may be executed after the upper open end of the vent hole is closed by the solder resist film. In this case, however, the Ni—Au plating needs to be applied to a non-through or closed hole. The non-through hole reduces a circulation efficiency of the plating liquid. Accordingly, ultrasonic waves or a vibrator needs to be used to force the plating liquid to circulate into the non-through hole. This results in an increase in the cost of the plating step.

To overcome the above-described drawback, the invention also provides an improved method of fabricating a semiconductor package. In the method, a vent hole and a through-hole are formed at predetermined locations of a double-side copper-clad laminate having both ends to which copper foils are attached respectively. Thereafter, a Cu plating is applied to the both sides of the laminate and inner circumferential surfaces of the vent hole and the through-hole. A plating resist pattern is then formed on a portion of the both sides of the laminate requiring no copper foil and thereafter, an antioxidant plated pattern is formed on a portion of the laminate exposing from the plating resist pattern. The plating resist pattern is then eliminated from the both sides of the laminate and thereafter, an unnecessary portion of the copper foil is eliminated from the both sides of the laminate by etching with the antioxidant plated pattern serving as an etching resist. A wiring pattern, a through-hole conductor and a metal film covering the vent hole are formed. Thereafter, a solder resist film is formed on each side of the laminate so that a portion of the wiring pattern other than a connecting terminal portion and the upper open end of the vent hole are covered with the solder resist film. Thereafter, a semiconductor chip is die-bonded on the solder resist film on the die-bonding area of the laminate and then overmolded with a sealing resin.

According to the above-described method, the antioxidant plating is applied to the exposed portion of the Cu plated coat of the vent hole before the upper open end of the vent hole is closed by the solder resist film. The plating liquid is permitted to freely flow vertically through the vent hole as well as through the through hole. Consequently, a fine antioxidant plated pattern can be formed on the exposed portion of the Cu plated coat of the vent hole without use of the ultrasonic waves or the vibrator.

BRIEF DESCRIPTION OF THE DRAWINGS

Other objects, features and advantages of the present invention will become clear upon reviewing the following description of the preferred embodiments, made with reference to the accompanying drawings, in which:

FIGS. 5A to 5G illustrate the method of fabricating the plastic BGA package of a second embodiment in accordance with the invention;

DETAILED DESCRIPTION OF THE PREFERRED EMBODIMENTS

Figure 1:
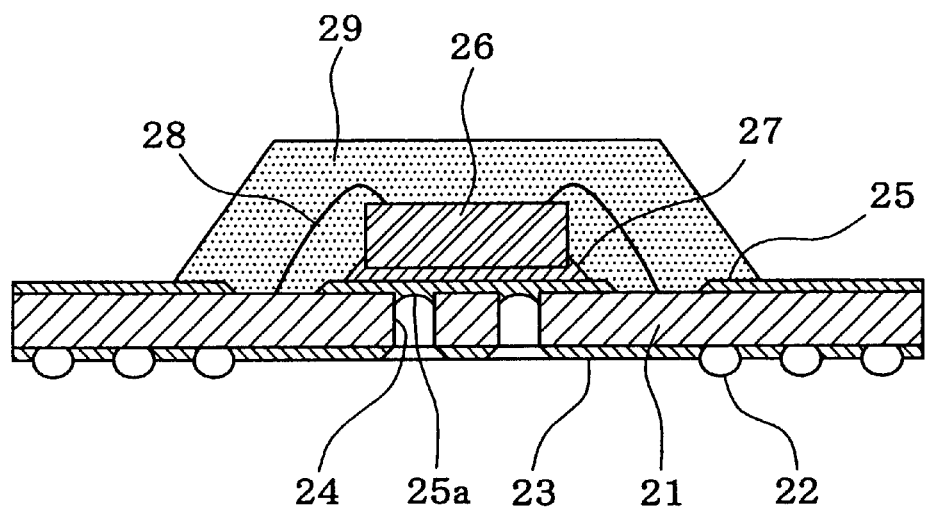
FIG. 1 is a longitudinal section of the plastic BGA package of an embodiment in accordance with the present invention.

A first embodiment of the present invention will be described. Referring to FIG. 1, a plastic BGA package in accordance with the invention is shown. The package comprises a plastic substrate 21 which is a single layer or multilayer printed substrate made of a resin, such as a bismaleimyd-triazine (BT) epoxy resin, as a base material. The resin has high heat resistance, dielectric property, insulating property and workability. Conductor patterns, pads, etc. none of which are shown are formed on both sides of the plastic substrate 21 by a subtractive method or an additive method. A number of solder balls 22 serving as connecting electrodes are formed on the backside of the substrate 21. A solder resist 23 is coated on an exposed surface of the backside other than the solder balls 22.

A die-bonding area of the substrate 21 has one or a plurality of vent holes 24 formed by punching so as to extend vertically therethrough. A wiring pattern area of the substrate 21 has a number of through-holes (not shown) formed by punching. The wiring pattern formed on the upper side of the substrate 21 is electrically connected via the through-holes to the solder balls 22 formed on the backside of the substrate 21. A solder resist 25 is coated on a portion of the wiring pattern area other than connecting terminals (pads) and the die-bonding area on the upper side of the substrate 21. A solder resist film 25a on the die-bonding area covers an upper open end of the vent hole 24 at a die-bonding side.

The plastic substrate 21 has a thickness ranging between 0.1 and 0.4 mm, for example. The vent hole 24 has a diameter ranging between 0.15 and 0.5 mm and more specifically between 0.2 and 0.4 mm. When the upper open end of the vent hole 24 is covered with the solder resist film 25a, the vent hole 24 has a hollow interior extending from the lower open end thereof and having a range equal to or larger than one third or more preferably one half of a thickness of the plastic substrate 21.

A semiconductor chip 26 is die-bonded on the solder resist film 25a of the die-bonding area by an adhesive agent 27 such as an Ag paste. Bonding wires 28 such as metal wires electrically connect between the electrodes of the semiconductor chip 26 and the pads on the upper side of the plastic substrate 21. The semiconductor chip 26 and the bonding wires 28 are sealed by the transfer molding of a sealing resin 29 such as an epoxy resin.

Figure 3A:
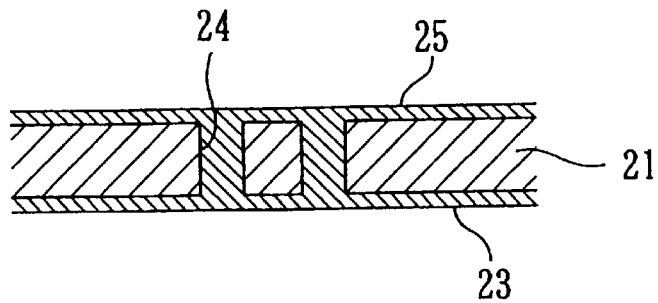
FIGS. 3A to 3C illustrate steps of forming the solder resist film covering the upper open end of the vent hole.
Figure 3B:
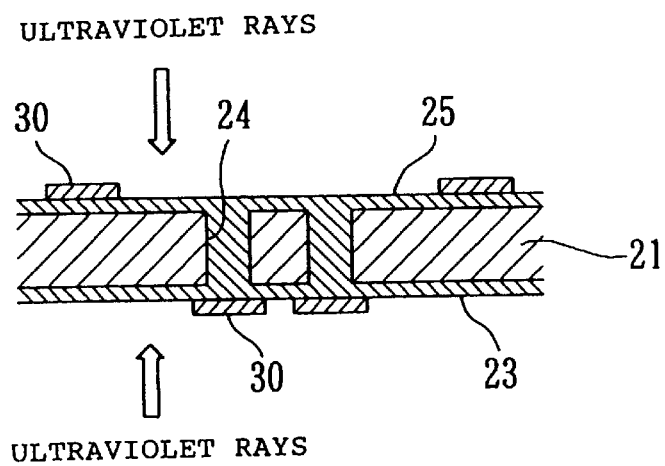

The solder resist film 25a covering the upper open end of the vent hole 24 of the substrate 21 is formed as follows. Liquid photosensitive solder resists 23 and 25 of the ultraviolet-ray hardened type are screen-printed on or applied to both sides of the plastic substrate 21 respectively, as shown in FIG. 3A. Part of the liquid solder resist flows into the vent hole 24 at this time. Thereafter, an unnecessary portion of the solder resist 23, for example, the lower open end of the vent hole 24, is covered with a mask 30 as shown in FIG. 3B and ultraviolet rays are irradiated onto exposed portions of the solder resists 23 and 25 so that the exposed portions are hardened.

Figure 3C:
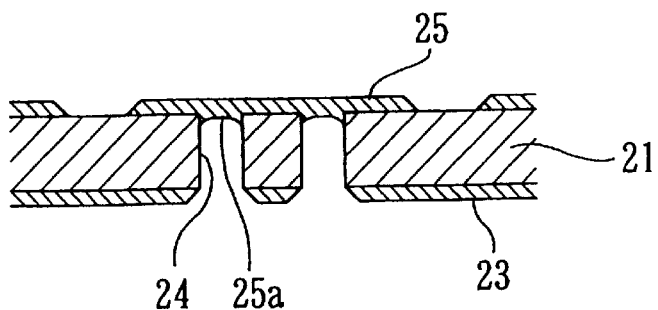

Thereafter, the mask 30 is removed and unhardened portions of the solder resists 23 and 25 are melted to be eliminated with hardened portions remaining. As a result, the solder resist in the vent hole 24 is eliminated except a part thereof at the upper side such that the solder resist film 25a covering the upper open end of the vent hole 24 is formed, as shown in FIG. 3C. Thus, the cavity is formed extending from the lower open end of the vent hole 24 and having a length equal to or larger than one third or more preferably one half of the thickness of the plastic substrate 21.

Figure 4A:
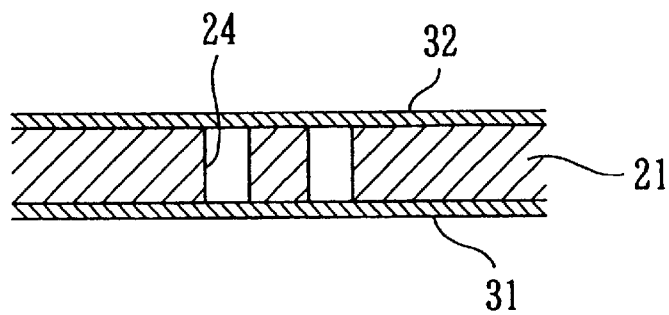
FIGS. 4A to 4C also illustrate steps of forming the solder resist film covering the upper open end of the vent hole.
Figure 4B:
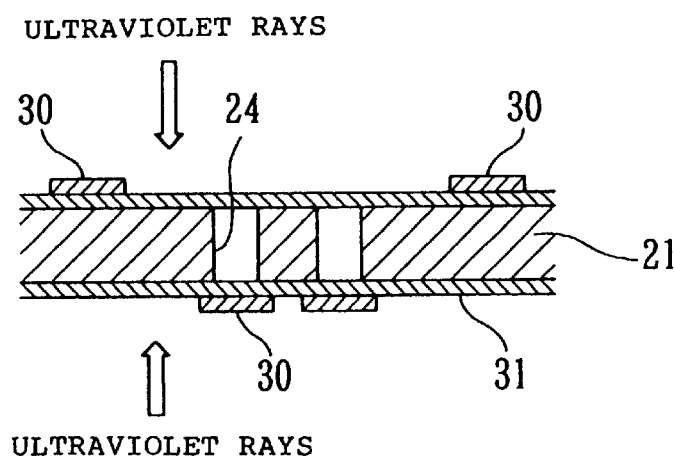
Figure 4C:
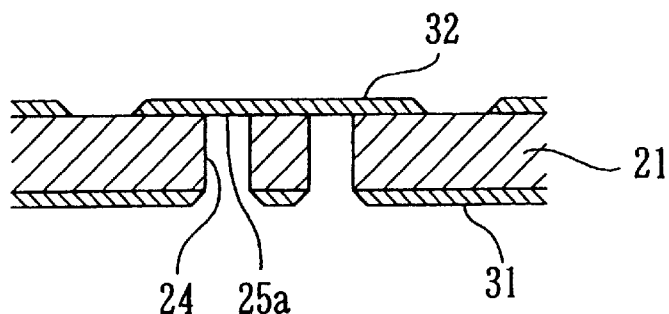

A dry film (photosensitive film) of solder resist may be used instead of the liquid photosensitive solder resist. In this case, dry films of solder resists 31 and 32 are caused to adhere to the both sides of the plastic substrate 21 respectively as shown in FIG. 4A. Thereafter, unnecessary portions of the solder resists, for example, the lower open end of the vent hole 24, are covered with the masks 30 as shown in FIG. 4B and ultraviolet rays are irradiated onto exposed portions of the dry films 31 and 32 so that the exposed portions are hardened. Thereafter, the masks 30 are removed and unhardened portions of the dry films 31 and 32 are melted to be eliminated with hardened portions remaining. As a result, the solder resist film 25a covering the upper open end of the vent hole 24 is formed, as shown in FIG. 4C. In this case, no solder resist flows into the vent hole 24 such that the entire vent hole is hollow.

Thus, the solder resist film 25a prevents the adhesive agent 27 from flowing into the vent hole 24 in the die-bonding step when closing the upper open end of the vent hole 24 of the plastic substrate 21. Consequently, gas permeability of the vent hole 24 can be ensured. Furthermore, since the solder resist film 25a also has gas permeability, moisture vapor produced in the package during the reflow heating etc. is released outside through the vent hole 24 and the solder resist film 25a. Consequently, an increase in the vapor pressure in the package is restrained and accordingly, the popcorning phenomenon and the delamination can be prevented.

In this case, the cavity having the length equal to or larger than one third of the thickness of the plastic substrate 21 is ensured in the vent hole 24, and accordingly, a range of the vent hole in which the solder resist exists is less than two thirds of the thickness of the plastic substrate 21. Consequently, the gas permeability of the solder resist film 25a can be ensured in the vent hole 24 such that an increase in the vapor pressure in the vent hole can be restrained.

Figure 2:
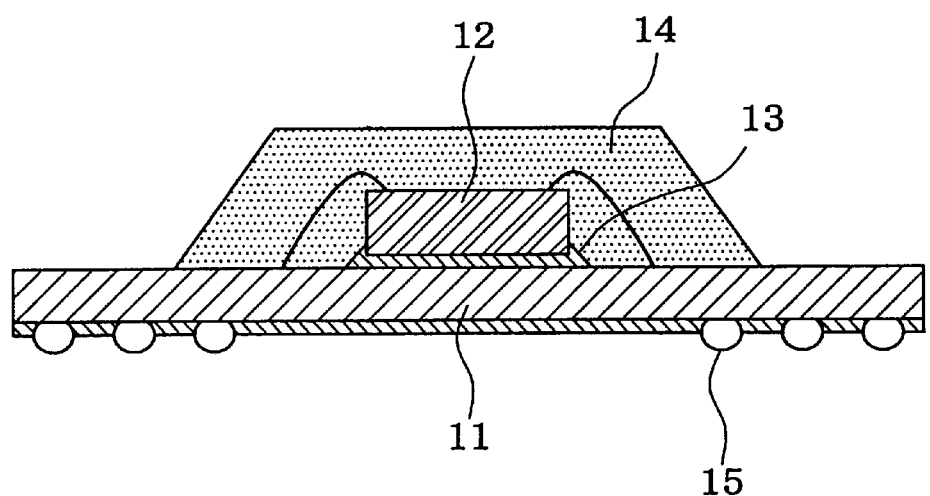
FIG. 2 is a longitudinal section of a conventional plastic BGA package.

A moisture resistance (MR) test for evaluation of moisture resistance was carried out regarding the above-described structure of the first embodiment and the conventional structure of FIG. 2 for confirmation of the effects of the first embodiment. The test and the results thereof are summarized as follows. Regarding the first embodiment, a plastic BGA package which is 27 mm square and has 324 pins was formed. A sum of 16 vent holes each having a diameter of 0.3 mm were formed in the plastic substrate by punching. Solder resist films were formed on both sides of the plastic substrate in the method of FIGS. 3A to 3C. Thereafter, a semiconductor chip 10 mm square was bonded to the plastic substrate by an Ag paste. Thereafter, a sealing resin was formed by the transfer molding so as to overmold the semiconductor chip.

On the other hand, no vent hole was formed in the die-bonding area of the plastic substrate in the prior art structure. The other structure of the conventional plastic BGA package is the same as that of the package of the first embodiment.

Twenty-five samples of the packages of the first embodiment and the prior art were prepared respectively. The MR test was carried out in an atmosphere with a temperature of 85° C. and a humidity of 60% for 168 hours. Consequently, neither the popcorning nor delamination was produced in all the samples of the first embodiment, so that a high moisture resistance reliability was confirmed regarding the first embodiment. On the other hand, the popcorning phenomenon was seen in all the samples of the conventional structure.

FIGS. 5A to 5G illustrate a second embodiment of the invention. In the second embodiment, the plastic substrate is a double-side copper-clad laminate 43 in which copper foils 42 are previously bonded to both sides of the resin substrate 41 such as the BT epoxy resin or a glass epoxy resin. The plastic BGA package is fabricated through the following steps. The laminate 43 is first drilled so that one or a plurality of vent holes 44 are formed therethrough. A number of through-holes (not shown) are also formed through the laminate 43 by punching. The vent holes 44 are formed in the die-bonding area of the laminate 43, whereas the through-holes are formed in the wiring pattern area thereof.

Thereafter, an electroless Cu-plating is applied to the both sides of the laminate 43 and the inner circumferential surfaces of the vent holes 44 and the through-holes so that a plated coat with a film thickness ranging between 0.5 and 2 $\mu$m is formed. Thereafter, an electrolytic Cu-plating is applied to the substantially entire surface of the electroless Cu-plated coat so that a Cu-plated coat 45 with a film thickness ranging between 10 and 25 $\mu$m is formed.

A plated resist pattern 46 is formed on the surface of the Cu-plated coat 45 in the next step as follows. First, a dry film of solder resist is stuck on the entire surface of the Cu-plated coat 45. Portions of the dry film corresponding to the wiring patterns, the through holes and the vent holes 44 are covered with masks (not shown). Ultraviolet rays are irradiated onto an exposed portion of the dry film to harden the latter. Thereafter, the masks are removed and the unhardened portion of the dry film is melted to be eliminated with the hardened portion remaining. As a result, a plated resist pattern 46 is formed so as to cover the unnecessary portions of the copper foils 42.

Thereafter, an Ni-plating is applied to a portion of the Cu-plated coat 45 exposed from the plated resist pattern 46 and an Au-plating is then applied to an Ni-plated coat so that an antioxidant plated pattern 47 is formed. Alternatively, the Ni-plating and an Au-plating may be applied after application of the Cu-plating so that the antioxidant plated pattern 47 is formed. Each of these plating processes may be electroless or electrolytic.

The plated resist pattern 46 is eliminated by an eliminating agent, and thereafter, unnecessary portions of the Cu-plated coat 45 and the copper foils 42 are etched with the antioxidant plated pattern 47 serving as an etching resist (mask), thereby being eliminated. As a result, a metal film 48 covering the wiring patterns, the through hole conductors and the vent hole 44. The Ni-plating and the Au-plating serves to improve a wire bonding property of the semiconductor package and an adhesiveness of the solder balls as well as to provide for antioxidation.

Thereafter, solder resist films 49 and 50 are formed on both sides of the double-side copper-clad laminate 43 in the same manner as in the first embodiment, so that portions of the wiring patterns except the connecting terminals (pads) and the upper open end of the vent hole 44 are covered with the solder resist films 49 and 50. As a result, the vent hole 24 as shown in FIG. 1 has a cavity extending from the lower open end of the vent hole and having a length equal to or larger than one third or more preferably one half of a thickness of the plastic substrate 21. A semiconductor chip (not shown) is mounted on the die-bonding area of the double-side copper-clad laminate 43 by wire bonding etc. The semiconductor chip and the wire-bonded portions are overmolded with the sealing resin.

The same effect can be achieved in the second embodiment as in the first embodiment.

Figure 6:
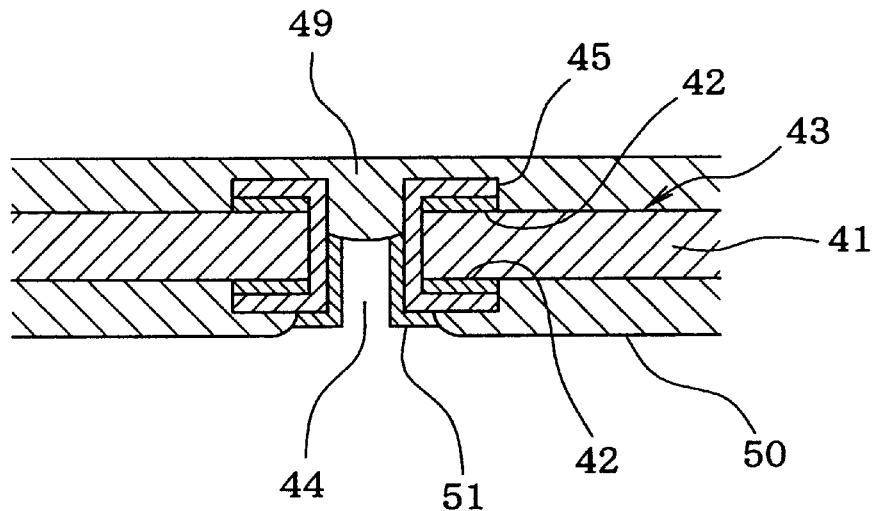
FIG. 6 is a partially enlarged longitudinal section of the plastic BGA package of a third embodiment in accordance with the invention.

FIG. 6 illustrates a third embodiment of the invention. In the third embodiment, the step of forming the antioxidant plated pattern 51 on the exposed portion of the Cu-plated coat 45 of the vent hole 44 is carried out after the solder resist films 49 and 50 have been formed on the sides of the double-side copper-clad laminate 43 respectively.

Accordingly, the antioxidant plated pattern 51 is formed only on the portions exposed from the solder resist films 49 and 50. The other steps are the same as those in the second embodiment.

In the third embodiment, the plating step of forming the antioxidant plated pattern 51 on the exposed portion of the Cu-plated coat 45 of the vent hole 44 is carried out after the upper open end of the vent hole 44 has been closed by the solder resist film 49. Accordingly, the plating needs to be applied to a non-through hole. In this case, a circulation efficiency of the plating liquid is reduced. In view of this, ultrasonic waves or a vibrator needs to be used to circulated the plating liquid into the non-through hole. However, this results in an increase in the plating cost.

To solve the above-described drawback, the second embodiment provides a fabricating method in which the antioxidant plating is applied to the exposed portion of the Cu-plated coat 45 of the vent hole 44 before the upper open end of the vent hole 44 is closed by the solder resist film 49. As a result, the plating liquid is allowed to freely flow vertically through the vent hole 44 as flows through a through-hole. Thus, a fine antioxidant plated pattern 51 can be formed on the exposed portion of the Cu-plated coat 45 of the vent hole 44 without forced circulation of the plating liquid by the ultrasonic waves or the vibrator. Consequently, the plating cost can be reduced.

Figure 7:
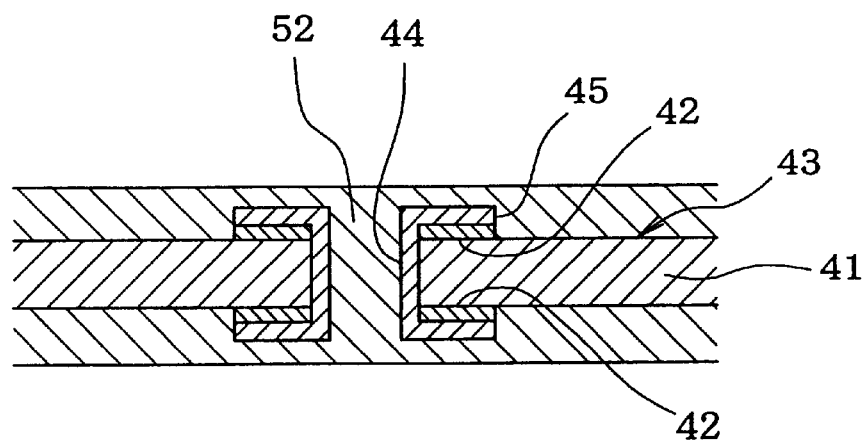
FIG. 7 is a partially enlarged longitudinal section of the plastic BGA package of a compared example.

The moisture resistance (MR) test for evaluation of moisture resistance was carried out regarding the above-described plastic BGA packages of the second and third embodiments and a compared example as shown in FIG. 7. The test and the results thereof are summarized as follows. Regarding the compared example, the vent hole 44 is completely filled with the solder resist 52 without application of the antioxidant plating to the Cu-plated coat 45 of the vent hole 44. Thereafter, the semiconductor chip (not shown) is die-bonded on the die-bonding area and then overmolded with the resin.

Samples of the packages of the second and third embodiments and the compared example were prepared respectively. The MR test was carried out in an atmosphere with a temperature of 85° C. and a humidity of 60% for 168 hours. Consequently, neither the popcorning nor delamination was produced in all the samples of the second and third embodiments, so that a high moisture resistance reliability was confirmed regarding these embodiments. On the other hand, the popcorning phenomenon was seen in the compared example.

The present invention should not be limited to the plastic BGA package. The invention is applicable to plastic PGA packages and other types of plastic packages.

The foregoing description and drawings are merely illustrative of the principles of the present invention and are not to be interpreted in a limiting sense. Various changes and modifications will become apparent to those of ordinary skill in the art. All such changes and modifications are seen to fall within the scope of the invention as defined by the appended claims.

What is claimed is:

1. A semiconductor device comprising:

a plastic substrate having a die-bonding area and a vent hole formed in the die-bonding area so as to extend vertically therethrough, the vent hole having upper and lower open ends;

a solder resist film formed on the die-bonding area so as to cover the upper open end of the vent hole;

a semiconductor chip die-bonded by an adhesive agent on the solder resist film on the die-bonding area of the plastic substrate; and a sealing resin overmolding the semiconductor chip, wherein the solder resist film has gas permeability and prevents the adhesive agent from flowing into the vent hole.

2. A semiconductor device according to claim 1, wherein the solder resist penetrates the vent hole through the upper open end thereof and a penetrated part of the solder resist has a depth that is less than two thirds of the thickness of the plastic substrate.

3. A semiconductor device according to claim 1, wherein the vent hole has a diameter ranging between 0.15 mm and 0.5 mm.

4. A semiconductor device according to claim 1, wherein the vent hole has an inner circumferential surface covered with a Cu plated coat further covered with an antioxidant plated pattern in its entirety.

5. A semiconductor device according to claim 1, wherein the vent hole has an inner circumferential surface covered with a Cu plated coat including a portion thereof exposed from the solder resist film, said portion being covered with an antioxidant plated pattern.

6. A semiconductor device according to claim 1, wherein the solder resist film is made of a dry film of solder resist.

* * * * *